(12) United States Patent
Stegamat (10) Patent No.: US 7,224,116 B2
(45) Date of Patent: May 29, 2007

(54) ENCAPSULATION OF ACTIVE ELECTRONIC DEVICES

(75) Inventor: Reza Stegamat, Milpitas, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 17 days.

(21) Appl. No.: 10/242,656

(22) Filed: Sep. 11, 2002

(65) Prior Publication Data

US 2004/0046500 A1    Mar. 11, 2004

(51) Int. Cl.
*H05B 33/00* (2006.01)

(52) U.S. Cl. ............ 313/506; 313/509; 313/512; 445/24

(58) Field of Classification Search ............ 313/506, 313/509; 428/690
See application file for complete search history.

(56) References Cited

U.S. PATENT DOCUMENTS

| | | | |
|---|---|---|---|
| 5,018,048 A | 5/1991 | Shaw et al. | |
| 5,032,472 A | 7/1991 | Michel et al. | |
| 5,079,200 A | 1/1992 | Jackson | |
| 5,107,174 A | 4/1992 | Galluzzi et al. | |
| 5,125,138 A | 6/1992 | Shaw et al. | |
| 5,192,240 A | 3/1993 | Komatsu | |
| 5,508,586 A | 4/1996 | Martelli et al. | |
| 5,520,564 A | 5/1996 | DeMars | |
| 5,652,067 A * | 7/1997 | Ito et al. | 428/690 |
| 5,686,360 A * | 11/1997 | Harvey et al. | 438/28 |
| 5,701,055 A | 12/1997 | Nagayama et al. | |
| 5,725,909 A | 3/1998 | Shaw et al. | |
| 5,731,661 A | 3/1998 | So et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,844,363 A | 12/1998 | Gu et al. | |
| 5,855,994 A | 1/1999 | Biebuyck et al. | |
| 5,874,804 A | 2/1999 | Rogers | |
| 5,877,895 A | 3/1999 | Shaw et al. | |
| 5,882,761 A | 3/1999 | Kawami et al. | |
| 5,895,228 A | 4/1999 | Biebuyck et al. | |
| 5,936,342 A | 8/1999 | Ono et al. | |
| 5,945,174 A | 8/1999 | Shaw et al. | |
| 6,005,692 A | 12/1999 | Stahl | |
| 6,010,751 A | 1/2000 | Shaw et al. | |

(Continued)

FOREIGN PATENT DOCUMENTS

| | | |
|---|---|---|
| EP | 0 776 147 B1 | 8/2001 |
| WO | WO 00/36661 | 6/2000 |
| WO | WO 00/36665 | 6/2000 |
| WO | WO 00/76276 A1 | 12/2000 |
| WO | WO 01/18886 A2 | 3/2001 |
| WO | WO 01/19142 A1 | 3/2001 |

OTHER PUBLICATIONS

Sato, Y. et al., "Stability of organic electroluminescent diodes", *Molecular Crystals and Liquid Crystals*, vol. 253, 1994, pp. 143-150.
Copy of corresponding pending U.S. Appl. No. 10/137,163.
Werner Espe et al., "Getter Materials for Electron Tubes", Electronics, Oct. 1950, pp. 80-86.

*Primary Examiner*—Mariceli Santiago
*Assistant Examiner*—Anthony Perry
(74) *Attorney, Agent, or Firm*—Fish & Richardson P.C.

(57) ABSTRACT

An electronic device protected by a novel barrier layer is provided. The barrier layer can protect against contamination and degradation arising from many sources, including oxidation and moisture. The barrier layer includes a barrier material that can include oxides, carbides, and compositions of sodium, aluminum, and fluorine.

31 Claims, 10 Drawing Sheets

U.S. PATENT DOCUMENTS

| | | | |
|---|---|---|---|
| 6,023,125 A * | 2/2000 | Yoshikawa et al. | 313/310 |
| 6,042,443 A | 3/2000 | Carella et al. | |
| 6,049,167 A | 4/2000 | Onitsuka et al. | |
| 6,080,031 A | 6/2000 | Rogers et al. | |
| 6,081,071 A | 6/2000 | Rogers | |
| 6,083,628 A | 7/2000 | Yializis | |
| 6,099,746 A | 8/2000 | Kim | |
| 6,104,138 A | 8/2000 | Martelli et al. | |
| 6,137,220 A | 10/2000 | Nagayama et al. | |
| 6,177,352 B1 | 1/2001 | Schonfeld et al. | |
| 6,198,217 B1 | 3/2001 | Suzuki et al. | |
| 6,198,220 B1 | 3/2001 | Jones et al. | |
| 6,210,815 B1 | 4/2001 | Ooishi | |
| 6,214,422 B1 | 4/2001 | Yializis | |
| 6,214,474 B1 * | 4/2001 | Barbist et al. | 428/469 |
| 6,215,245 B1 | 4/2001 | Mori | |
| 6,218,004 B1 | 4/2001 | Shaw et al. | |
| 6,221,456 B1 | 4/2001 | Pogorski et al. | |
| 6,224,948 B1 | 5/2001 | Affinito | |
| 6,228,436 B1 | 5/2001 | Affinito | |
| 6,231,939 B1 | 5/2001 | Shaw et al. | |
| 6,232,178 B1 | 5/2001 | Yamamoto | |
| 6,259,204 B1 | 7/2001 | Ebisawa et al. | |
| 6,278,234 B1 | 8/2001 | Ono et al. | |
| 6,563,262 B1 | 5/2003 | Cao | |
| 6,565,770 B1 * | 5/2003 | Mayer et al. | 252/301.36 |
| 6,566,808 B1 | 5/2003 | Duggal et al. | |
| 6,572,784 B1 * | 6/2003 | Coombs et al. | 252/301.16 |
| 6,605,893 B2 | 8/2003 | Ando | |
| 6,614,057 B2 | 9/2003 | Silvernail | |
| 6,617,611 B2 | 9/2003 | Hasegawa et al. | |
| 6,620,513 B2 | 9/2003 | Yuyama et al. | |
| 6,621,840 B2 * | 9/2003 | Araki | 372/39 |
| 6,628,086 B2 | 9/2003 | Hayashi et al. | |
| 6,652,343 B2 | 11/2003 | Hasegawa et al. | |
| 6,693,296 B1 | 2/2004 | Tyan | |
| 6,699,728 B2 | 3/2004 | Guenther et al. | |
| 6,798,133 B1 | 9/2004 | Ambrugger et al. | |
| 6,887,733 B2 | 5/2005 | Klausmann et al. | |
| 6,911,667 B2 | 6/2005 | Pichler et al. | |
| 2001/0013756 A1 | 8/2001 | Mori et al. | |
| 2002/0015818 A1 | 2/2002 | Takahashi et al. | |
| 2002/0033667 A1 | 3/2002 | Yamashita | |
| 2003/0038590 A1 | 2/2003 | Silvernail et al. | |
| 2003/0058192 A1 | 3/2003 | Arai | |
| 2003/0094607 A1 | 5/2003 | Guenther et al. | |
| 2003/0117068 A1 | 6/2003 | Forrest et al. | |
| 2003/0197197 A1 | 10/2003 | Brown et al. | |
| 2003/0205845 A1 | 11/2003 | Pichler et al. | |
| 2003/0207500 A1 | 11/2003 | Pichler et al. | |
| 2003/0209979 A1 | 11/2003 | Guenther et al. | |
| 2003/0214232 A1 | 11/2003 | Guenther et al. | |
| 2004/0036411 A1 | 2/2004 | Kim et al. | |
| 2004/0046500 A1 | 3/2004 | Stegamat | |
| 2004/0048033 A1 | 3/2004 | Klausmann et al. | |
| 2004/0048037 A1 | 3/2004 | Klausmann et al. | |
| 2004/0051449 A1 | 3/2004 | Klausmann et al. | |
| 2004/0108811 A1 | 6/2004 | Klausmann et al. | |

* cited by examiner

FIG. 1

(Prior Art)

Boron Oxide

FIG. 5

Control

Boron Oxide

FIG. 9 control

FIG 10

ENCAPSULATION OF ACTIVE ELECTRONIC DEVICES

CROSS REFERENCE TO RELATED APPLICATIONS

This application is related to the following applications being filed concurrently:

U.S. Ser. No. 10/242,266, entitled "ENCAPSULATION FOR ORGANIC DEVICES" by Hagen Klausmann, Yuen Sin Lew, Hou Siong Tan and Hooi Bin Lim U.S. Ser. No. 10/242,068, entitled "METHOD OF FABRICATING ELECTRONIC DEVICES" by Hagen Klausmann and Bernd Fritz and U.S. Ser. No. 10/242,004, entitled "OLED DEVICES WITH IMPROVED ENCAPSULATION" by Hagen Klausmann and Bernd Fritz. All of these applications are incorporated by reference herein in their entirety.

BACKGROUND

Organic electroluminescence (EL) has been studied extensively because of its possible applications in discrete light emitting devices, arrays, displays, backlights, and segmented displays. Such devices are suitable for many applications, including lighting and sign applications. Organic materials can potentially replace conventional inorganic materials in many applications and enable wholly new applications. The ease of fabricating organic EL devices promises even more efficient and durable materials, which can contribute to further improvements in device architecture.

Organic light emitting devices (OLEDs) function much like inorganic LEDs. Depending on the actual design, light either passes through a transparent electrode deposited on a transparent glass substrate, through a transparent top electrode, or both. The first OLEDs were very simple in that they constituted only a few layers. Recent developments have led to OLEDs having many different layers (known as multilayer devices), each optimized for a specific task.

A performance limitation with some OLED devices is reliability. It has been demonstrated that some of the organic materials are very sensitive to contamination, oxidation, and humidity. Furthermore, some of the metals used as contact electrodes for OLEDs are susceptible to corrosion in air or other oxygen and/or moisture-containing environments.

To obtain efficient OLED devices, low field electron injection generally requires low work function cathode metals, such as Mg, Ca, Li, Ba, or CsF, which readily react with oxygen and water. A low work function calcium cathode, for example, survives only a short time in air due to rapid device degradation caused by atmospheric moisture and oxygen. Such highly reactive metals can also undergo chemical reactions with the nearby organic materials present within the device, which can also have negative effects on the device. Utilizing a low work function material cathode requires careful handling of the device to avoid contamination of the metal, and immediate, high quality encapsulation of the device if operation in the atmosphere is desired.

Figure 1:
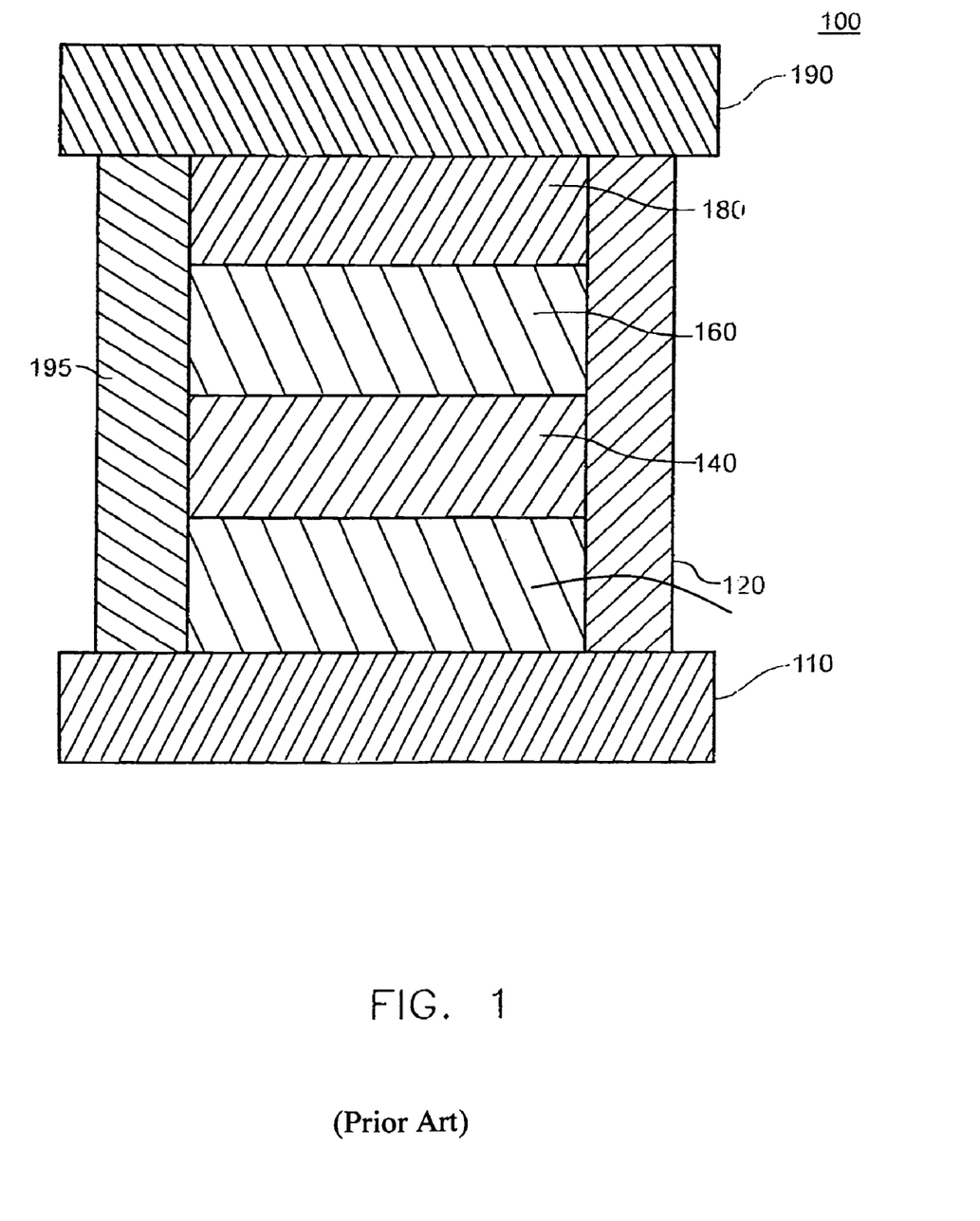
FIG. 1 shows a conventional organic LED.

Many approaches have been attempted in order to solve the problem of device instability and degradation. FIG. 1 illustrates a conventional device. OLED 100 includes substrate 110, anode 120, organic emitting layer 140, cathode 160, and getter 180. Mechanically installed top cover 190 and adhesive sealant 195 are applied to seal the device from the atmosphere. The top cover is often glass, metal, metal film, metallized plastic, or a plastic film with inorganic constituents. The adhesive sealant can be applied in many ways, for example, as a glue or laminate.

In addition to the mechanically applied cover and sealant, a sacrificial or "getter" layer 180 is deposited on the device. Because the getter layer includes a low work function material, such as a metal, that degrades or reacts with any moisture or oxygen that diffuses through the cover/sealant, the getter helps prevent degradation of the lower layers of the device.

However, at least two disadvantages exist for this method. First, pinholes often exist in the getter layer which still provide ample pathways for oxygen and water to reach the electrode metal below. This phenomenon is more completely described in Y. Sato et al., *Stability of organic electroluminescent diodes,* Molecular Crystals and Liquid Crystals, Vol. 253, 1994, pp. 143–150, for example. When the water passes through the getter and cathode layers, it reaches the emitting layer, causing dark spots in the display. While the combination of mechanically applied covers and adhesives with getter layers slows atmospheric contamination of the device, it may not prevent such contamination.

Second, as the getter layer residing directly on cathode 160 is oxidized and absorbs moisture from the air, it corrodes the cathode. As the cathode is corroded, photon yield or efficiency is reduced, thus darkening the display. Therefore, the lifetime of current organic light emitting devices is limited due to this inability to prevent atmospheric degradation of their highly reactive interior components.

Organic LEDs have great potential to outperform conventional inorganic LEDs in many applications. One important advantage of OLEDs, and devices based thereon, is that they are less expensive than their inorganic LED counterparts. Organic LEDs can be deposited on large, inexpensive glass substrates, or a wide range of other inexpensive transparent, semitransparent or even opaque crystalline or non-crystalline substrates at low temperature, rather than on expensive crystalline substrates of limited areas at comparatively higher growth temperatures (as is the case for inorganic LEDs). The substrates may even be flexible, enabling pliant OLEDs and new types of displays.

As can be seen from the above description, there is an ongoing need for simple and efficient materials and methods for protecting the interior layers of active electronic devices, including organic light emitting devices. The present invention overcomes at least one of the disadvantages associated with conventional devices.

SUMMARY

In one aspect, the invention provides an electronic device including a substrate, an active electronic layer, and a barrier layer.

In another aspect, the invention provides an electronic device including a substrate, a first electrode, an active electronic layer, a second electrode, and a barrier layer.

In another aspect, the invention provides a method of forming an electronic device where a barrier material is deposited onto a device that includes a substrate, a first electrode, an active electronic layer, and a second electrode.

In another aspect, the invention provides a pixilated display that includes an active electronic material and a barrier material.

The scope of the present invention is defined solely by the appended claims, and is not affected to any degree by the statements within this summary.

DETAILED DESCRIPTION

The present invention includes forming a novel, atmospheric barrier layer on an active electronic device. In one aspect, the device is an organic light-emitting device. In another aspect, the device is a charge transport device. In another aspect, the device is a semiconductor device. In another aspect, the device is a light responsive device.

The present invention is particularly suited to providing a barrier layer for devices having susceptibility to atmospheric contamination, especially devices incorporating active electronic layers that degrade at higher operation temperatures and/or humidity. The present invention may be used in combination with any conventional sealing/protection method, such as with a mechanically installed top cover and adhesive sealant, for example. While embodiments of the present invention can protect any appropriate device, they are especially suited to protecting devices subjected to only direct film encapsulation.

Figure 2:
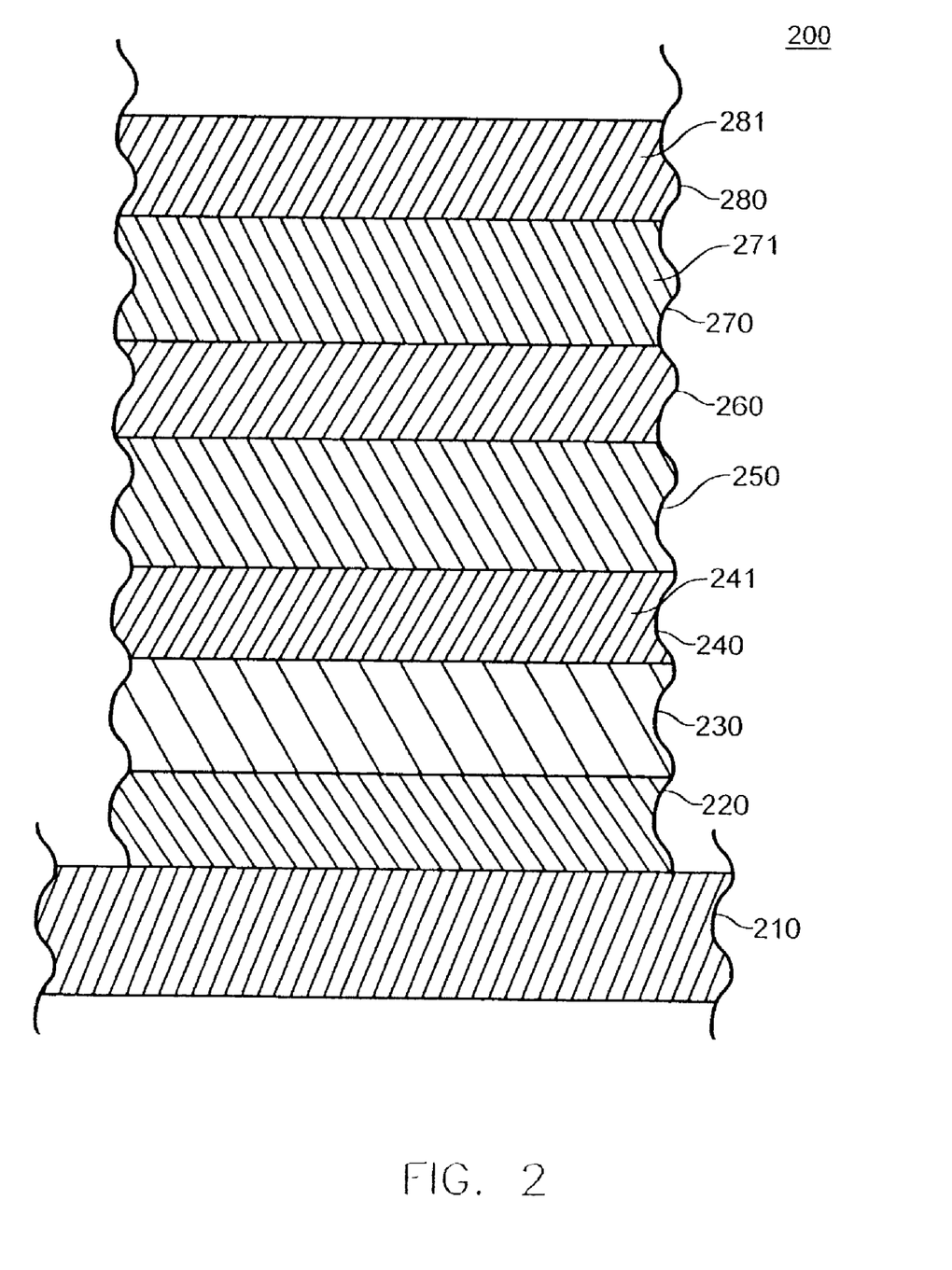
FIG. 2 shows a device embodying features of the current invention.

Referring to FIG. 2, which is not drawn to scale, first electrode layer 220 is deposited on substrate 210. Optional first efficiency enhancing layer 230 is coated on first electrode layer 220. Active electronic layer 240 is deposited on first efficiency enhancing layer 230, if present, or directly on first electrode layer 220. Optional second efficiency enhancing layer 250 is deposited on active electronic layer 240. Second electrode layer 260 is deposited on second efficiency enhancing layer 250, if present, or directly on active electronic layer 240. Barrier layer 270 is deposited on second electrode layer 260. Optional getter layer 280 is deposited on barrier layer 270. The wavy lines at the vertical edges of the layers denote that the layers may continue in directions parallel to the long and short axis of substrate 210.

While not shown in FIG. 2, the relative position of first electrode layer 220 and second electrode layer 260 may be reversed. In this embodiment, the optional first and second efficiency enhancing layers, 220 and 250, respectively, may also be reversed. For example, a device illustrative of this arrangement could have a second electrode layer 260 deposited on substrate 210. Optional second efficiency layer 250 could then be coated on second electrode layer 260. Active electronic layer 240 could then be deposited on second efficiency enhancing layer 250, if present, or directly on second electrode layer 260. Optional first efficiency enhancing layer 230 could then be deposited on active electronic layer 240. First electrode layer 220 could then be deposited on first efficiency enhancing layer 230, if present, or directly on active electronic layer 240. Barrier layer 270 could then be deposited on first electrode layer 230. An optional getter layer 280 could then be deposited on barrier layer 270.

Additional barrier and getter layers (not shown) may be used in any combination. Thus, in addition to barrier 270, a second barrier could be used, with or without getter 280. Likewise, in addition to barrier 270 and getter 280, a second getter layer could be used. Finally, in addition to barrier 270, multiple, alternating barrier and getter layers could be used. As used in the specification and appended claims, "on" includes when layers are adjacent and when layers are separated by one or more intervening layer.

While the device pictured in FIG. 2 can emit through the substrate 210 "bottom," depending on the materials and layer arrangement chosen, the devices can, in fact, emit from the bottom, top, side, or any combination of the three. For example, by using a transparent barrier layer 270, such as molybdenum oxide, the device can "top" emit. Thus, devices which emit through barrier layer 270, through the substrate 210, through the sides of the layers, or through any combination thereof are also contemplated.

For example, in one embodiment the device may have a transparent first electrode 220 and an opaque second electrode 260. In another aspect, the device may have an opaque first electrode 220 and a transparent second electrode 260.

If the device is to be used in a display, first electrode 220 and/or second electrode 260 may not be in a flat, continuous sheet, but patterned into separate areas, such as rows and columns. Thus, they can be discontinuous. To form a pixilated display, such as for use in a computer monitor, the rows in the first and second electrodes are preferably perpendicular to each other. Alternatively, only one of the two electrodes may be patterned. In this embodiment the second electrode can form a "blanket" or continuous sheet, that may be used in active-matrix OLEDs, alpha-numeric displays, and other segmented displays.

While many methods are known to those of ordinary skill in the art to form a discontinuous electrode, the electrodes are typically either deposited in rows initially, or deposited in a continuous sheet and then etched or otherwise cut into rows. Common photolithographic and other etching methods may be used. Additionally, a precision laser beam may be used to remove the material between the rows or to harden the material into rows so the remaining material may be removed. The present invention is especially useful for devices having pixilated cathodes, which expose a significant amount of unprotected, perimeter cathode area.

Additionally, the barrier layer application techniques and structures of the present invention could be used in a vast array of applications including, but not limited to: active matrix, passive matrix, segmented, alpha-numeric, TFT, and backlit LED or OLED displays. Any of these devices could have TFT, LED, or OLED structures patterned on the substrate that are much higher than the LED or OLED stack itself, for example, several micron high row separators (e.g. mushrooms) or ink-confinement wells/banks such as used in ink-jet-printed OLEDs.

Additionally, the present invention also includes other displays and any electronic apparatus that requires a barrier layer for atmospheric protection, such as organic transistors, detectors, solar-cells, and light sources, including backlights. The barrier layers can be applied to a plethora of devices, such as when a plurality of devices is disposed upon a substrate.

Substrate (210)

Substrate 210 can be any material, which can support the layers, and is transparent or semi-transparent to the wavelength of light generated in the device. Substrate 210 can also be opaque in top-only emitting devices. By modifying or filtering the wavelength of light which can pass through the substrate, the color of light emitted by the device can be changed. Preferable substrate materials include glass, quartz, silicon, and plastic, with thin, flexible glass being especially preferred at present. The preferred thickness of substrate 210 depends on the material used and on the application of the device. The substrate can be in the form of a sheet or continuous film, such as preferably used for roll-to-roll manufacturing processes, which are particularly suited for plastic, metal, and metallized plastic foils.

First Electrode (220)

First electrode 220 can be transparent, semi-transparent, or opaque to the wavelength of light generated within the device. In one embodiment, first electrode 220 functions as an anode when an electric potential is applied across the first electrode and second electrode 260. When an electric potential is applied across first electrode 220 and second electrode 260, which can serve as a cathode, photons are released from active electronic layer 240 that pass through first electrode 220 and substrate 210.

Many materials that can function as an anode are known to those of ordinary skill in the art. A composition that includes indium tin oxide (ITO) is preferred at present. Suitable glass substrates precoated with ITO may be purchased from Applied Films Corporation, 9586 I-25 East frontage Rd., Longmont, Colo., USA 80504.

Preferably, the thickness of the first electrode 220 is from about 10 to about 1000 nanometers (nm), more preferably from about 50 to about 200 nm, and most preferably is about 100 nm. While many methods are known to those of ordinary skill in the art by which the first electrode material can be deposited, evaporative methods and sputtering are preferred, with sputtering methods being particularly preferred at present.

First Efficiency Enhancing Layer (230)

To enhance the photon yield of the device in relation to the electric potential applied, optional efficiency enhancing layers may be disposed between first electrode 220 and active electronic layer 240. While many materials, which can function as an efficiency-enhancing layer are known to those of ordinary skill in the art, conductive polymers are preferred as a first efficiency enhancing layer 230. Preferred conductive polymers include, but are not limited to polyethylenedioxythiophene (PEDOT) and polyaniline (PANI).

Preferably, the thickness of first efficiency enhancing layer 230 is from about 5 to about 1000 nanometers (nm), more preferably from about 50 to about 500 nm, and most preferably from about 50 to about 250 nm.

First efficiency enhancing layer 230 is usually applied in the form of a solution. Many application methods are known to those of ordinary skill in the art. Examples include, but are not limited to, spin coating, dip coating, roll coating, spray-coating, blade coating, or thermal evaporation onto first electrode 220. Printing techniques including, but not limited to, screen-printing, flexographic printing, and ink-jet printing (drop-on-demand, continuous, or semi-continuous) may also be used to apply efficiency enhancing layer 230.

Active Electronic Layer (240)

Active electronic layer 240 can include one or more layers. Active electronic layer 240 includes an active electronic material 241. Active electronic material 241 can include a single active electronic material, a combination of active electronic materials, or multiple layers of single or combined active electronic materials. Preferably, at least one active electronic material is organic.

For organic LEDs (OLEDs), the active electronic layer 240 contains at least one organic material that emits light. These organic emitting materials generally fall into two categories. The first category of OLEDs, referred to as polymeric light emitting diodes, or PLEDs, utilize polymers as an active electronic material 241. The polymers may be organic, or organometallic, in nature. As used herein, the term organic is meant to include organometallic materials. Preferably, these polymers are solvated in an organic solvent, such as toluene or xylene, and spun (spin-coated) onto the device, although other methods are possible. Devices utilizing polymeric active electronic materials in active electronic layer 240 are especially preferred. In addition to materials that emit light, active electronic material 241 may include a light responsive material that changes its electrical properties in response to the adsorption of light. Light responsive materials are often used in detectors and solar panels that convert light energy to electrical energy.

Preferred polymeric light emitting materials include those materials that emit by fluorescence or by phosphorescence. In one aspect, the polymer is dispersed in a matrix, such as a poly(methylmethacrylate) matrix, for example. In another aspect the polymer is combined with an organic material.

More preferred polymeric light emitting materials include, but are not limited to, derivatives, copolymers, and polymeric blends that include polyparaphenelenevinylene moieties. More preferred polymeric emitting materials also include, but are not limited to, derivatives, copolymers, and polymeric blends that include polyfluorene moieties. More preferred phosphorescent polymers include, but are not limited to, those including benzophenones, benzophenones derivatives, benzophenones moieties, and mixtures thereof.

An especially preferred polymeric emitting material that emits yellow-light and includes polyphenelenevinylene derivatives is available as SY132 from Covion Organic Semiconductors GmbH, Industrial park Hoechst, Frankfurt, Germany. Another especially preferred polymeric emitting material that emits green-light and includes fluorene-co-polymers is available as Green K-16A from Dow Chemical, Midland, Mich.

In addition to polymers, smaller organic molecules that emit by fluorescence or by phosphorescence can serve as a light emitting material residing in active electronic layer 240. Unlike polymeric materials that are applied as solutions or suspensions, small-molecule emitting materials are preferably applied through evaporative, sublimation, or organic vapor phase deposition methods. Combinations of PLED materials and smaller organic molecules can also serve as emitting material 241. For example, a PLED may be chemically derivatized with a small organic molecule or simply mixed with a small organic molecule to form active electronic material 241.

Many preferable small-molecule emitting materials are known to those of ordinary skill in the art. More preferred small-molecule emitting materials are organic or organometallic compounds including, but are not limited to: quinolates, aluminum quinolate, triazines, oligomers, dendrimers, spiro-compounds, and mixtures thereof. Quinoline moieties derivatized with aluminum are especially preferred.

Preferably, the thickness of active electronic layer 240 is from about 5 to about 500 nanometers (nm), more preferably from about 20 to about 100 nm, and most preferably is about 75 nm.

In addition to active electronic materials that emit light, active electronic layer 240 can include an active electronic material 241 capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including $C_{60}$, and compositions including derivatized $C_{60}$ may be used. Active electronic layer 240 may also include semiconductors, such as silicon or gallium arsenide, as active electronic material 241.

Second Efficiency Enhancing Layer (250)

Optional second efficiency enhancing layer 250 preferably comprises a material capable of injecting electrons when the device is energized. It may be distinct from, or integrated with, the second electrode 260. More preferably, it includes a low work function material, such as barium, calcium, magnesium, alkali halide compounds and mixtures thereof, for example.

Preferably, the thickness of second efficiency enhancing layer 250 is from about 0.1 to about 50 nanometers (nm), more preferably from about 0.5 to about 10 nm, and most preferably from about 0.5 to about 5 nm. Second efficiency enhancing layer 250 is preferably applied by evaporative methods, but other methods known to those of ordinary skill in the art, such as sputtering, could also be utilized.

Second Electrode (260)

In one embodiment, second electrode 260 functions as a cathode when an electric potential is applied across the first electrode 220 and second electrode 260. In this embodiment, when an electric potential is applied across the first electrode 220, which serves as the anode, and second electrode 260, which serves as the cathode, photons are released from active electronic layer 240 that pass through first electrode 220 and substrate 210.

While many materials, which can function as a cathode, are known to those of skill in the art, most preferably a composition that includes aluminum, indium, silver, gold, magnesium, calcium, and barium, or combinations thereof, or alloys thereof, is utilized. Aluminum, aluminum alloys, ITO, and combinations of magnesium and silver or their alloys are especially preferred.

Preferably, the thickness of second electrode 260 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as physical vapor deposition (PVD) are preferred.

Barrier Layer (270)

Barrier layer 270, alone or in combination with getter layers, protects the device from environmental attack and subsequent processing steps. Environmental attack may be caused by oxygen or water from the atmosphere, for example, or by other portions of the device, such as getter layers. Barrier layer 270 also decouples top electrode 260 from subsequent layers, such as optional getter layer 280, or polymeric encasement layers (not shown). While the barrier layer may be applied to a layer other than the second electrode 260, such as if a device allows for a getter layer between the second electrode and the barrier layer, it preferably resides directly on the second electrode. Preferable embodiments include those that have the barrier layer 270 deposited directly on the second electrode, with optional getters and additional barriers.

Subsequent processing steps can include encasement with a polymer, such as polyacrylate or its derivatives, applied as a high-mobility solution. Depending on the composition of the barrier layer, it can protect active electronic layer 240 from the UV irradiation used to cure the encasement polymer. The Batelle "polymer multi-layer" (PML) technique is an example of subsequent processing in which polymer (usually acrylate or the like) and barrier layers are alternated.

Some specific benefits of barrier layer 270 include, but are not limited to, insulating the second electrode from the optional getter, preventing corrosion of the second electrode 260 by the optional getter 280, and providing a moisture and oxygen barrier to the device as a whole. Additionally, barrier layer 270 provides excellent adhesion with second electrode 260, thus preventing separation (peeling) and contaminant bypass of the barrier layer.

In addition to protecting individual devices, barrier layer 270 can also provide a continuous, non-conducting protective film for an entire device. As used in the specification and appended claims, while singular, the term "device" is meant to include a single device or a multitude of individual devices. Because barrier 270 may be applied in a continuous manner to the complete device surface, it can protect the otherwise exposed edges of the second electrode at the perimeter of the device. For example, multiple individual devices may be assembled on a larger substrate and protected by a continuous barrier layer 270. In one embodiment, such as a display for a mobile phone, many devices are processed on a single substrate sheet and protected by a continuous barrier layer that may leave the contact pads open at the edges for electrical contact.

In one embodiment, barrier layer 270 is from about 10 to about 10,000 nm thick, in another, about 50 to about 1000 nm thick, and in another, about 100 to about 400 nm thick. Preferably, the barrier layer is about 200 nm thick. As defined herein, thickness is the direction perpendicular to the substrate 210. The present embodiments include devices having at least one barrier layer.

Barrier layer 270 includes a barrier material 271 that is preferably deposited by placing the barrier material, in pellet, granule or powdered form, in a boat and inserting the boat and device into a vacuum evaporator. As the barrier material evaporates from the boat, it deposits onto the surface of the device. While the vacuum evaporator is operated at high vacuum, generally on the order of $10^{-6}$ to $10^{-7}$ Torr, the evaporation temperature varies based on the melting point of the barrier material being deposited. While evaporative methods via resistive or electron-beam heating are preferred, other methods known to those of skill in the art, such as sputtering and inorganic or organic vapor phase deposition, could also be utilized depending on the requirements of the barrier material.

Barrier layer 270 may include a single or multiple layers of a barrier material 271. Barrier layer 270 may also be formed by simultaneously depositing more than one barrier material. For example, if two barrier materials are placed in the vacuum evaporator with the device, the resultant barrier layer will be a combination of the two barrier materials.

Barrier Material (271)

Preferably, barrier material 271 can include oxides or carbides of molybdenum, boron, vanadium, or their alloys. The barrier material 271 can also include mixtures of these oxides or carbides. In one aspect, for example, molybdenum oxide is deposited on the device to yield a molybdenum oxide barrier material 271. In another aspect, for example, molybdenum carbonate is deposited on the device to yield a molybdenum carbide barrier material 271. In an especially preferred embodiment, molybdenum oxide, boron oxide, vanadium oxide, or a mixture thereof is deposited on the device as barrier material 271.

Barrier material 271 may also include compositions of sodium, aluminum, and fluorine. Preferably, these compositions are stable in the atmosphere and contain the three elements in various ratios.

In a preferred embodiment, barrier material 271 includes molybdenum oxide. More preferably, barrier material 271 includes $Mo_xO_y$, with x=1 and y=3 being especially preferred. Because molybdenum oxide has a low melting point of about 800° C. and an evaporation temperature from about 350° to 500° C. at $10^{-6}$ Torr, it is preferred for use with active electronic layers that degrade at higher deposition temperatures. The deposited molybdenum oxide films are hard, scratch resistant, and transparent, do not react with, for example, barium, and are electrically insulating. However, molybdenum oxide may also be applied to devices containing inorganic active electronic materials, if lower deposition temperatures are desired or required by the processing equipment.

In a second preferred embodiment, barrier material 271 includes boron oxide. More preferably, barrier material 271 includes $B_xO_y$, with x=2 and y=3 being especially preferred. Boron oxide has a melting point of about 460° C.

In a third preferred embodiment, barrier material 271 includes vanadium oxide. More preferably, barrier material 271 includes $V_xO_y$, with x varying from 1 to 3 and y varying from 1 to 5. In an especially preferred embodiment, x=2 and y=5.

In a fourth preferred embodiment, barrier material 271 includes compounds that are combinations of sodium, aluminum, and fluorine. More preferably barrier material 271 includes $Na_xAl_yF_z$ with X, Y and Z varying from 1 to 20. While these elements can be combined in many ratios, $Na_5Al_3F_{14}$ (known as chiolite) and $Na_3AlF_6$ (known as cryolite) are especially preferred.

Getter Layer (280)

Getter layer 280 includes any getter material 281 that functions to protect the device, such as by serving as a high efficiency desiccant. Preferable materials for use in getter layer 280 include, but are not limited to, alkali-earth metals, alkaline-earth metals, zeolites, reactive metals, reactive metal-oxides, and reactive metal-sulfides. Although shown as a layer in FIG. 2, getter material 281 may be separate from barrier layer 270. For example, the getter material 281 may be in the form of a tablet placed atop or adjacent to the device, or spaced apart from but adjacent to the device.

The thickness of the getter is not restricted, but is generally selected based on the degree of protection required for a specific device and application. Preferably, the thickness of getter layer 280 is from about 10 nanometers (nm) to about 5 mm, more preferably from about 100 nm to about 1 mm. The getter may be in any form, such as a thin film, a powder, a tablet, or a powder contained in a sachet, for example.

Multiple getter layers (not shown) can be used with a single barrier layer. In another embodiment, multiple barrier layers are used with a single getter layer (not shown). In a further embodiment, multiple barrier and getter layers are used in concert (not shown). For example, after the second electrode 270, a device could have the arrangement:

$MoO_3$ barrier→Mg getter→$MoO_3$ barrier→Mg getter→$MoO_3$ barrier.

Device Incorporation

Many organic or inorganic LEDs or other organic electronic devices made in accordance with the preferred embodiments can also be patterned onto a larger substrate and coated with additional layers. The additional layers may include the barrier layers of the present invention and/or additional layers, such as planarization layers that include, but are not limited to, acrylate polymers.

A more complete discussion of planarization layers, their use in combination with barrier layers, and their use in forming pixilated displays may be found in U.S. patent application Ser. No. 10/137,163, entitled "Improved Encapsulation for Organic Light Emitting Diodes Devices," filed May 2, 2002, and incorporated by reference in its entirety, except that in the event of any inconsistent disclosure or definition from the present application, the disclosure or definition herein shall be deemed to prevail.

The preceding description is not intended to limit the scope of the invention to the preferred embodiments described, but rather to enable any person of ordinary skill in the art of light-emitting device or generally organic electronic device fabrication to make and use the invention. Similarly, the examples below are not to be construed as limiting the scope of the appended claims or their equivalents, and are provided solely for illustration. It is to be understood that numerous variations can be made to the procedure below, which lie within the scope of the appended claims and their equivalents.

EXAMPLES

Comparative Example 1

Figure 3:
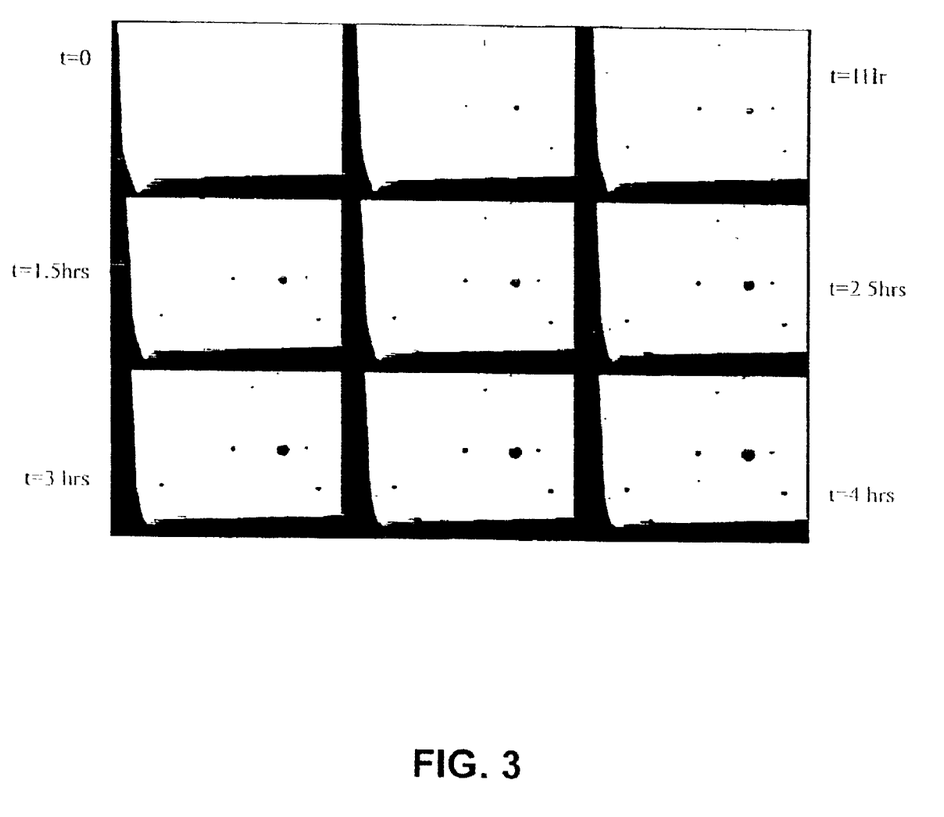
FIG. 3 shows time-lapse photography of a conventional device without a protective layer operated at 4.4 volts.
Figure 4:
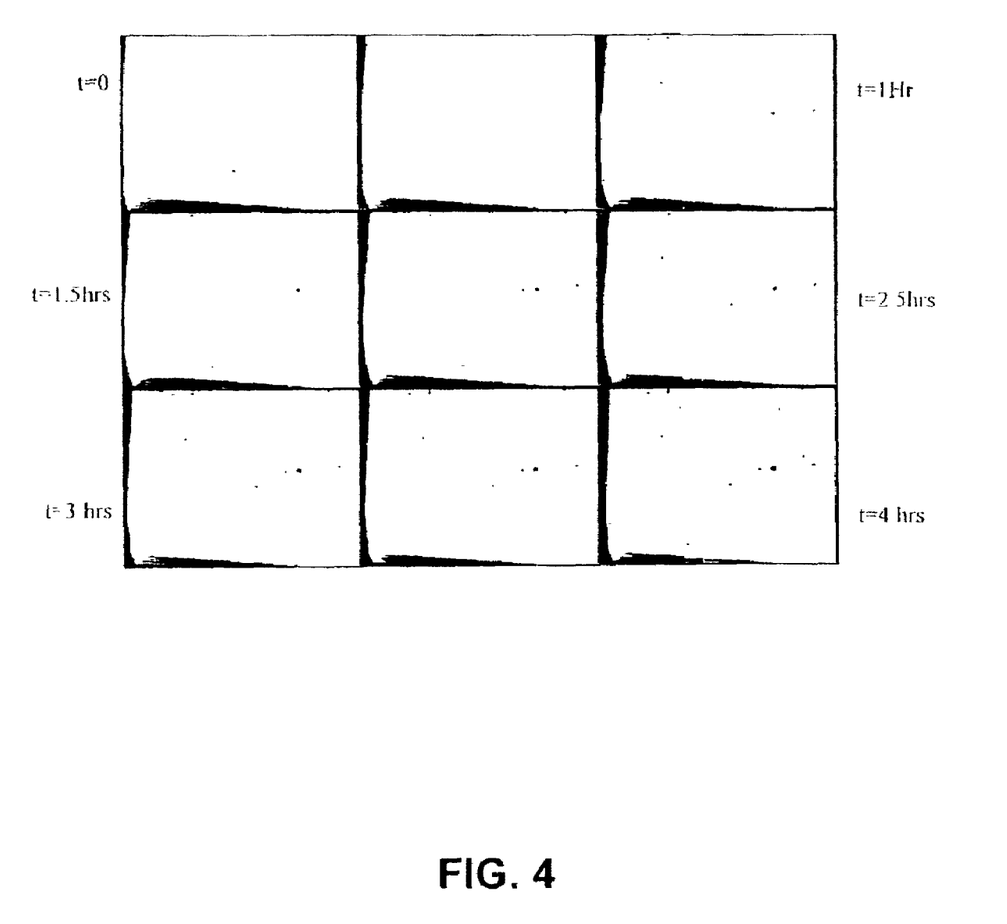
FIG. 4 shows time lapse photography of a device with molybdenum oxide embodying features of the present invention operated at 4.4 volts.

The growth rates of dark spots were compared on a device without a barrier layer, FIG. 3, and on a device with a molybdenum oxide barrier layer, FIG. 4.

Devices without the barrier layer were constructed by spin-coating about 63 nm of poly(3,4-ethylenedioxythiophene) onto prepatterned ITO-coated glass substrates, followed by deposition by spin-coating of about 70 nm of a yellow light emitting polymer (SY132 available from Covion) onto PEDOT. Poly(3,4-ethylenedioxythiophene) is available from H. C. Starck, 100 Bayer Road Pittsburgh, Pa. USA 15205-9741. The devices were completed by evaporating the cathode components including a thin layer of a barium charge injecting material and a thick layer of aluminum. The thickness of the deposited barium layer was about 3 nm. The thickness of the deposited aluminum layer was about 300 nm. Devices with the molybdenum oxide barrier layer were constructed by depositing about 220 nm of molybdenum oxide onto devices without the barrier layer.

Time-lapse photography was performed on the device without the molybdenum oxide barrier layer running at 4.4 volts. FIG. 3 shows the results over a four-hour period. The experiment was repeated with a device embodying features of the present invention having a molybdenum oxide barrier layer (FIG. 4). As is evident from the photographs, the dark spot growth rate was significantly more severe for the device without the molybdenum oxide barrier layer.

Example 2

To test the performance of single barrier layer versus multiple barrier layers with multiple getter layers the following structures were made:
glass/Ba(100 nm)/Mo$_x$O$_y$(200 nm); and
glass/Ba(100 nm)/Mo$_x$O$_y$(200 nm)/Mg(200 nm)/Mo$_x$O$_y$ (200 nm).

Both structures were exposed to air and the change in the barium layer coated on the glass was monitored with time. Elemental barium, in unprotected form, reacts in seconds with atmospheric moisture to form little water "islands" in its structure. The single 200 nm molybdenum oxide coating protected the barium for about 30 minutes. About 2 hours was required for the barium to react fully with water. Alternatively, the multilayer device did not show full reaction with water until about 15–20 hours, a vastly superior result.

The molybdenum oxide coating had good atmospheric barrier and insulating properties and was easily evaporated from a molybdenum boat. It is believed that devices protected with vanadium oxide will perform similarly.

Example 3

A device having boron oxide as a barrier layer was prepared with the following layer structure:
glass/ITO/PEDOT(63 nm)/SY132(70 nm)/Ba(3 nm)/Al (300 nm)/B$_x$O$_y$(220 nm).

Figure 5:
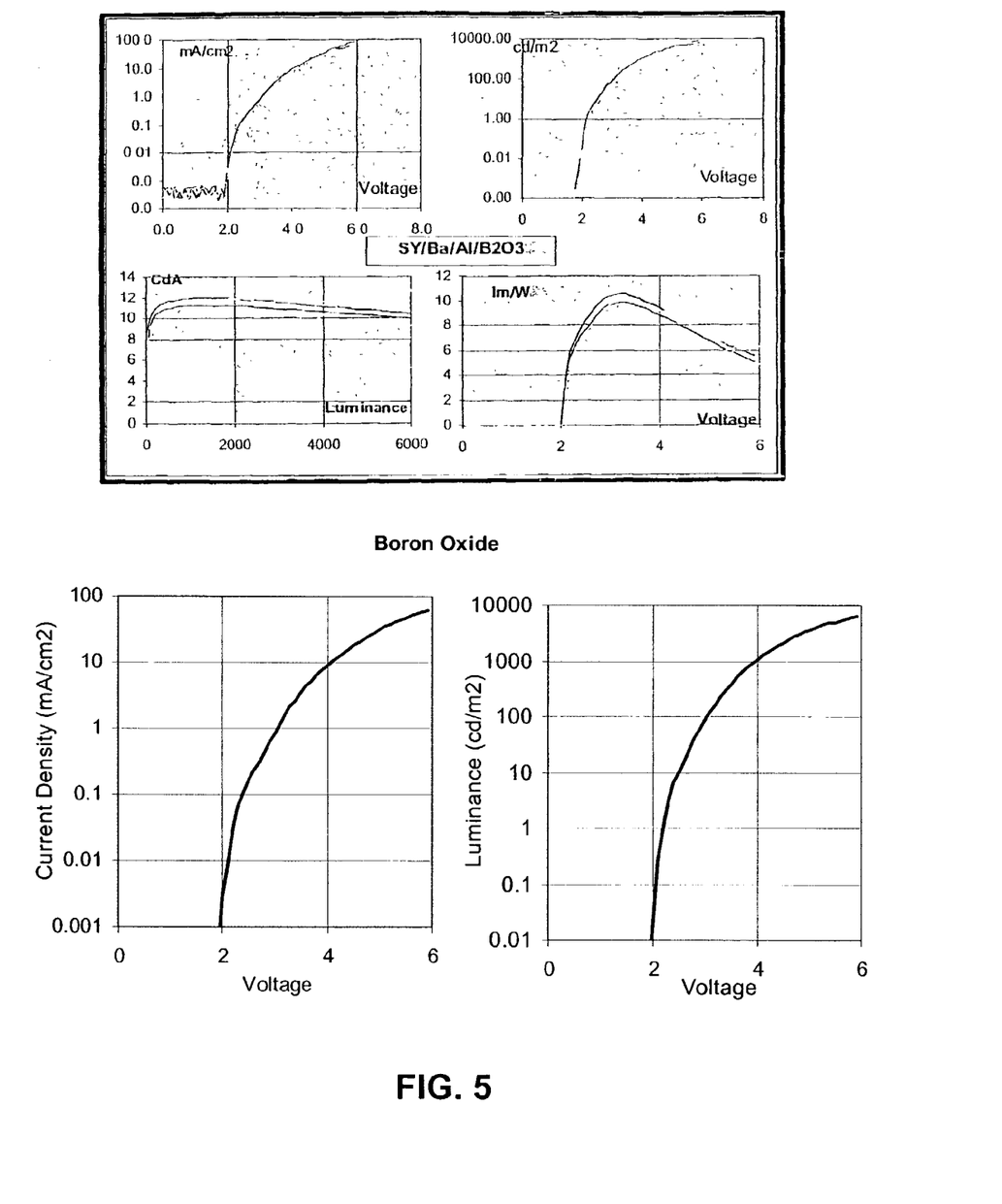
FIG. 5 shows current-voltage and luminance-voltage plots of a device with boron oxide embodying features of the present invention.
Figure 6:
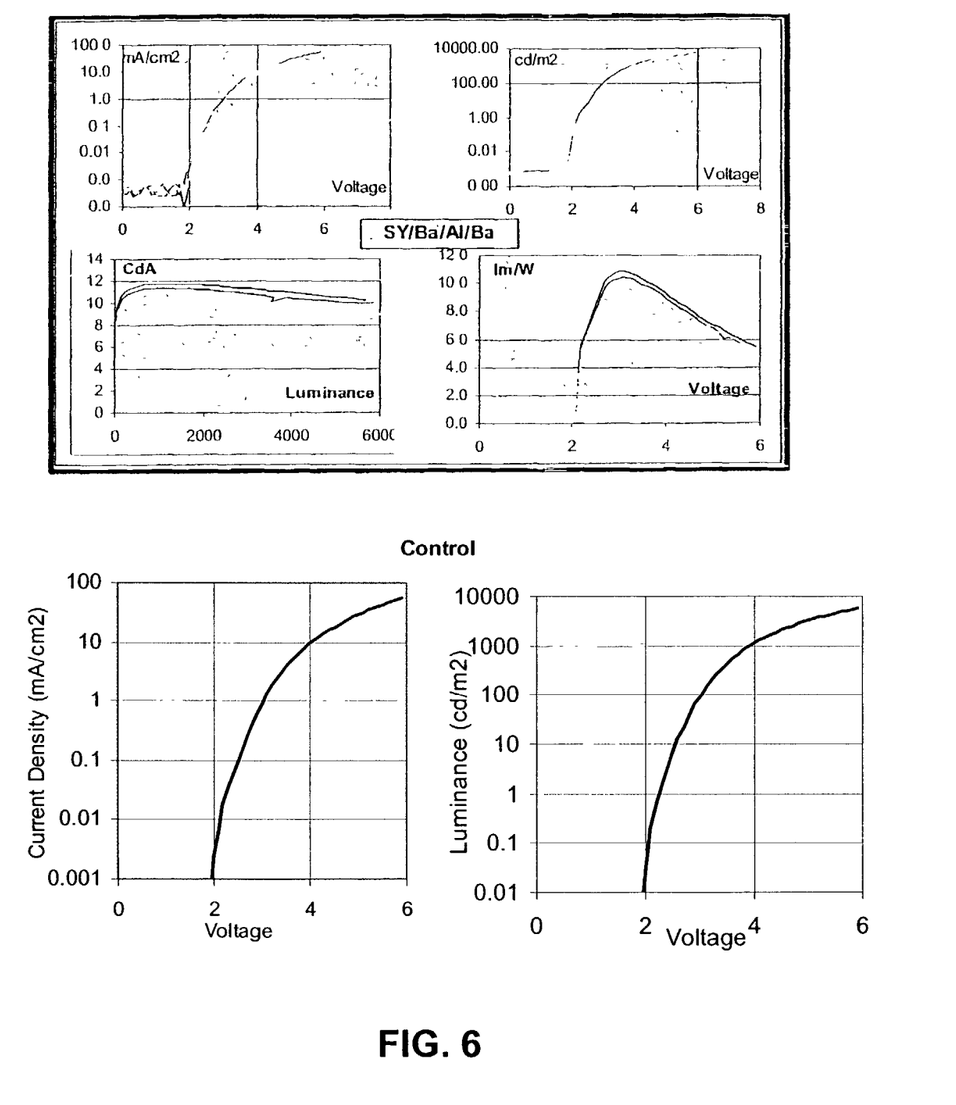
FIG. 6 shows current-voltage and luminance-voltage plots of a conventional device with 220 nm of barium as a protective layer
Figure 7:
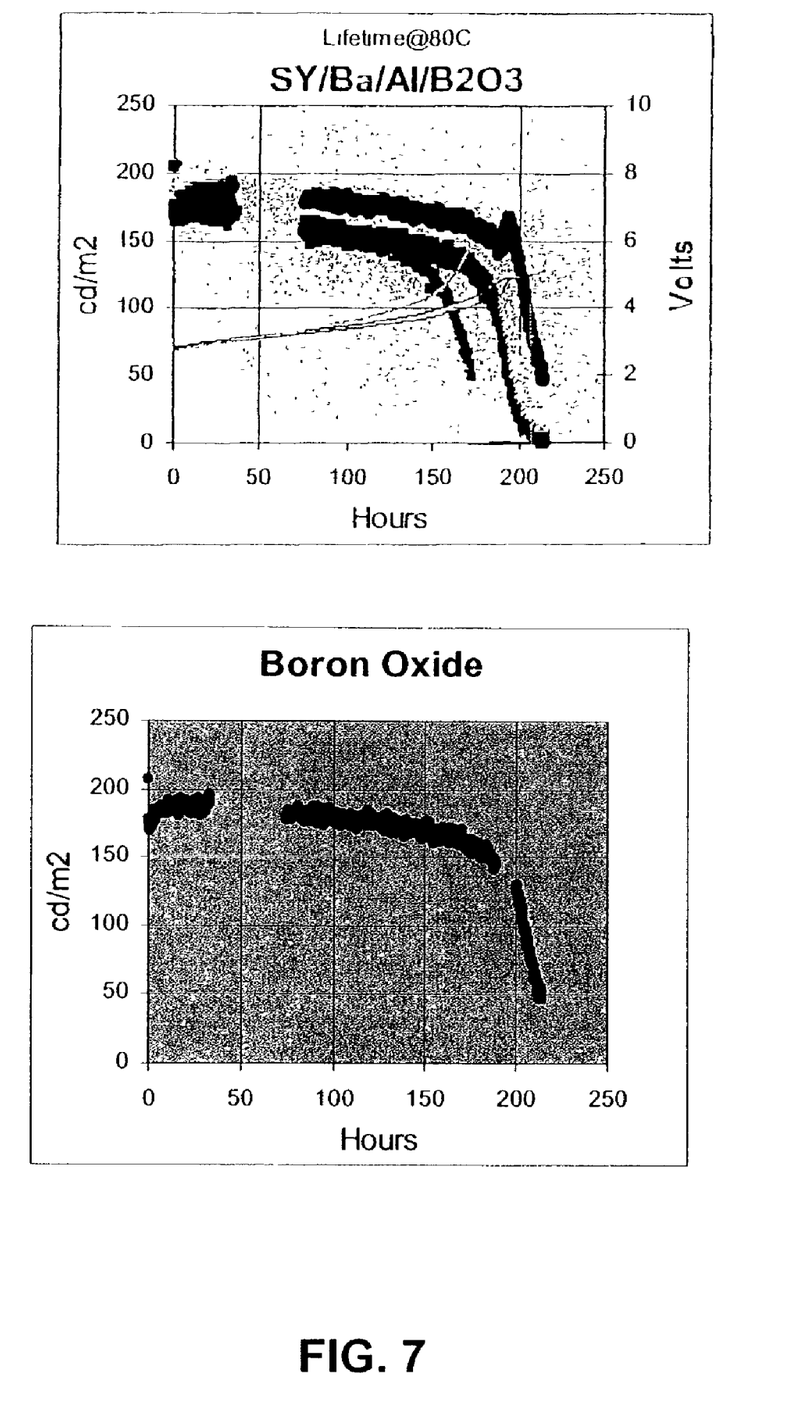
FIG. 7 shows an accelerated lifetime test performed at 80° C. for a device with 220 nm of boron oxide as a barrier layer embodying features of the present invention.
Figure 8:
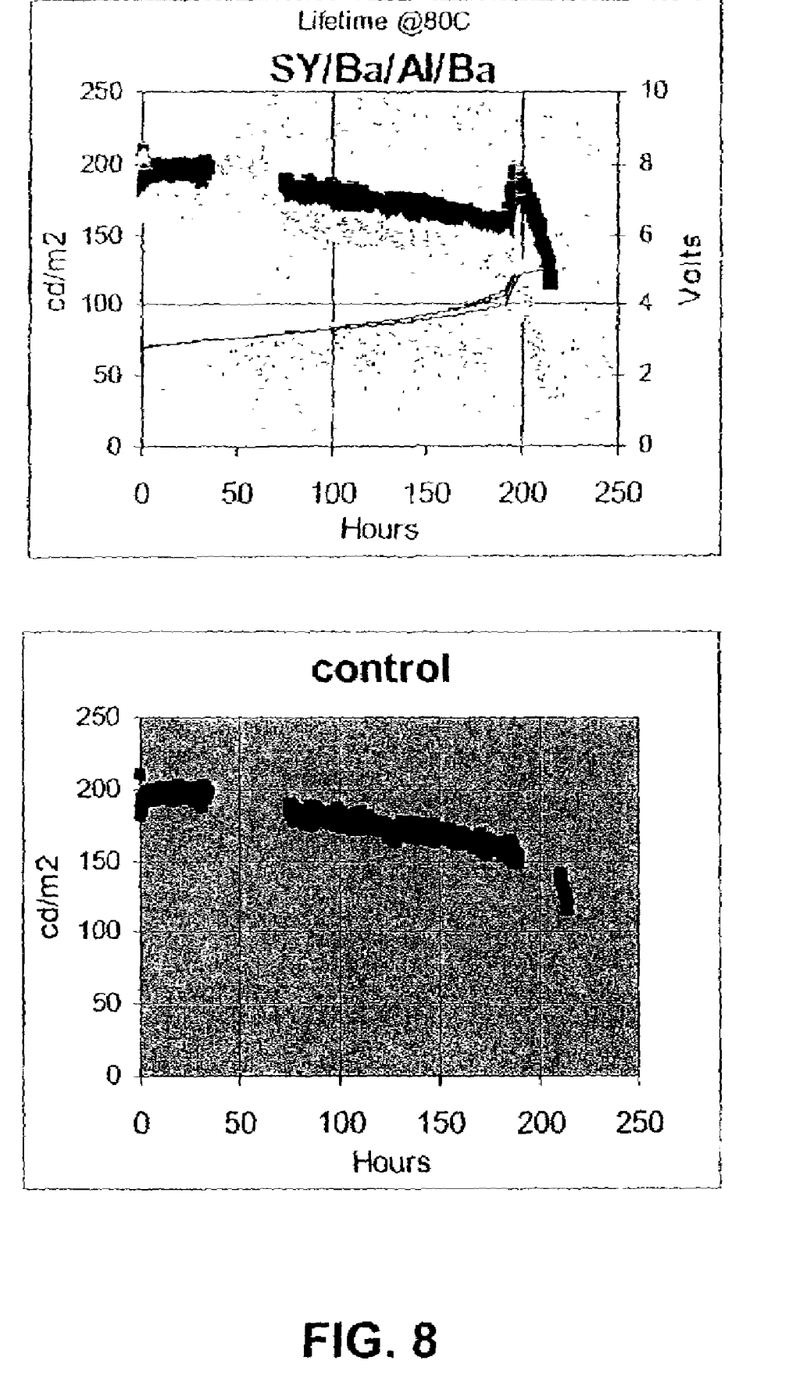
FIG. 8 shows an accelerated lifetime test performed at 80° C. for a conventional device having 220 nm of barium as a barrier layer.
Figure 9:
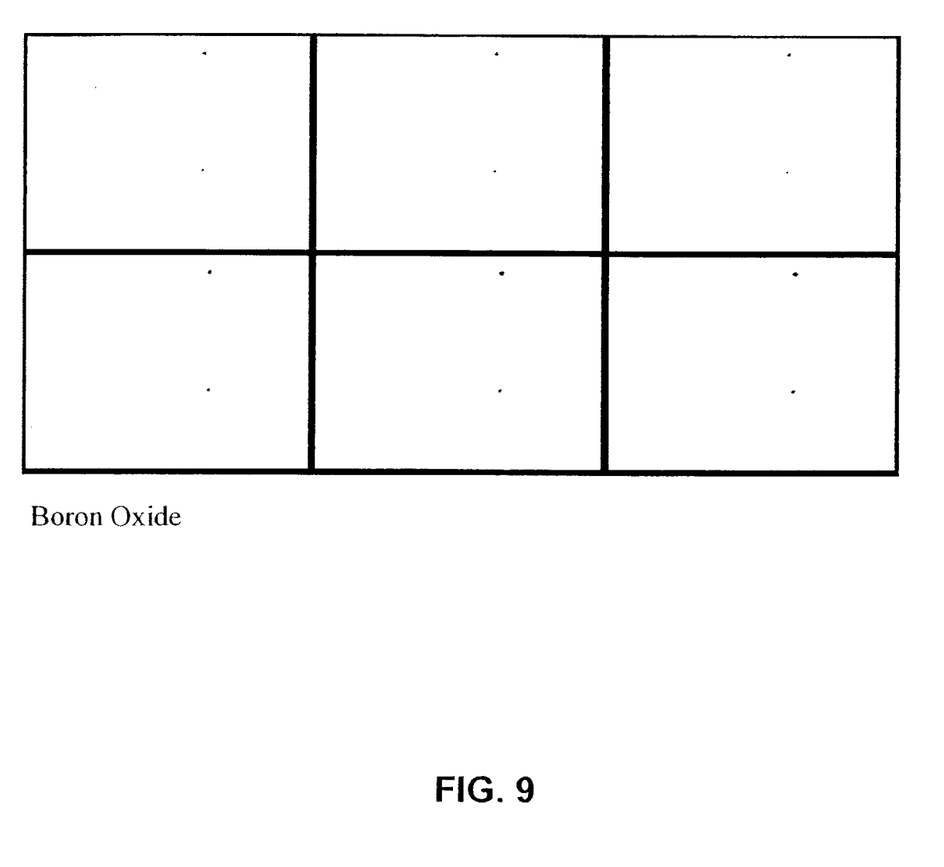
FIG. 9 shows time lapse photography of the growth of dark spots on a device with 220 nm of boron oxide embodying features of the present invention operated at 4.4 volts.
Figure 10:
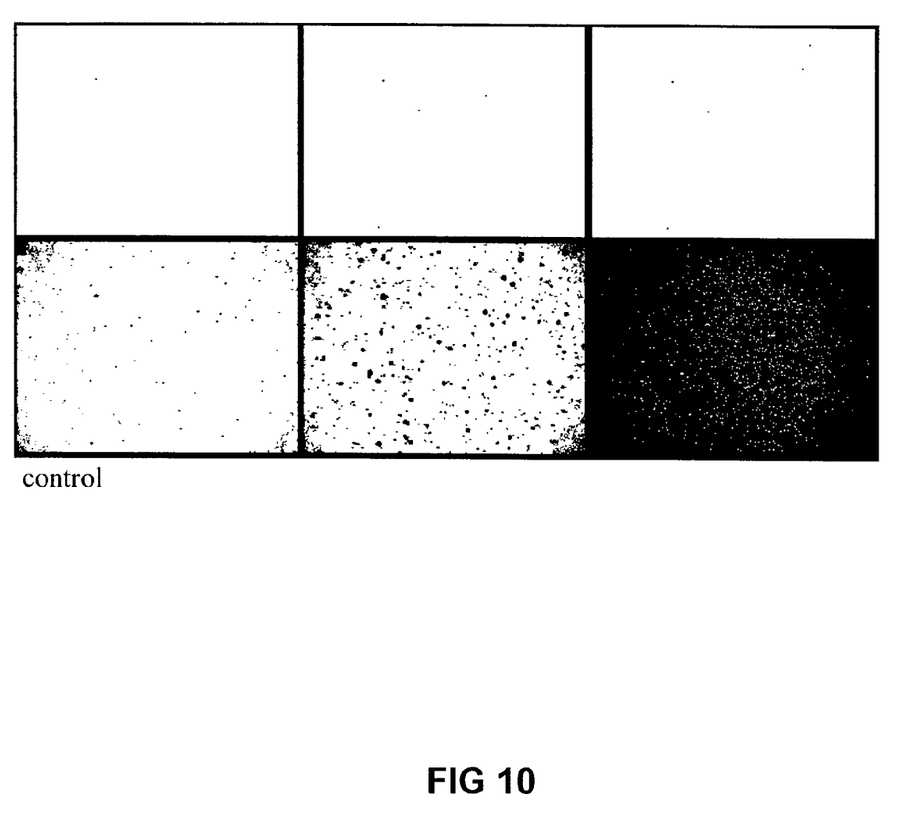
FIG. 10 shows time lapse photography of the growth of dark spots of a conventional device with 220 nm of barium operated at 4.4 volts.

The performance of the device as a function of voltage was plotted in FIG. 5. FIG. 6 is a comparative example with a control device having a 200 nm of layer of barium instead of the boron oxide barrier layer. Compared with the performance of the control device, no adverse effect was found due to the deposition of boron oxide. FIGS. 7 and 8 show 80° C. accelerated lifetime tests performed on the two devices. FIGS. 9 and 10, respectively, show the dark spot growth characteristics of an OLED with a boron oxide as the barrier layer and an OLED with a barium layer as the barrier layer, indicating the superior atmospheric stability of the device with the boron oxide barrier layer after 4.5 hours operation at 4.4 V in air.

As any person of ordinary skill in the art of organic electronic device such as light-emitting device fabrication will recognize from the description, figures, and examples that modifications and changes can be made to the preferred embodiments of the invention without departing from the scope of the invention defined by the following claims.

What is claimed:

1. An electronic device, for emitting light, comprising:
    a substrate;
    a first electrode on the substrate;
    an active electronic layer comprising an organic material on the first electrode;
    a second electrode on the active electronic layer; and
    a barrier layer on the second electrode,
    wherein said barrier layer comprises a barrier material selected from the group consisting of molybdenum carbide, vanadium carbide, an oxide of a molybdenum alloy, an oxide of a boron alloy, an oxide of a vanadium alloy, a composition comprising sodium, aluminum, and fluorine, and mixtures thereof.

2. The device of claim 1, wherein said barrier layer comprises molybdenum carbide, vanadium carbide or mixtures thereof.

3. The device of claim 1, wherein said baffler layer comprises a barrier material comprising Na$_x$Al$_y$F$_z$, wherein X, Y, and Z are from 1 to 20.

4. The device of claim 1, wherein said barrier layer comprises a material selected from the group consisting of Na$_5$Al$_3$F$_{14}$, Na$_3$AlF$_6$, and mixtures thereof.

5. The device of claim 1, wherein said first electrode comprises indium tin oxide.

6. The device of claim 1, further comprising an efficiency enhancing layer on said first electrode.

7. The device of claim 6, wherein said efficiency enhancing layer comprises a conductive polymer.

8. The device of claim 1, wherein said organic material is a polymer.

9. The device of claim 8, wherein said polymer comprises a phosphorescent polymer.

10. The device of claim 9, wherein said phosphorescent polymer is dispersed in a matrix.

11. The device of claim 9, wherein said phosphorescent polymer is dispersed in poly(methylmethacrylate).

12. The device of claim 1, wherein said organic material is a small-molecule material.

13. The device of claim 1, further comprising an efficiency enhancing layer on said active electronic layer.

14. The device of claim 13, wherein said efficiency enhancing layer comprises a low work function material.

15. The device of claim 1, further comprising at least one getter material.

16. The device of claim 15, wherein said getter material is on said barrier layer.

17. The device of claim 15, wherein said electronic device further comprises a cover supported by the substrate and said getter material is on the cover.

18. The device of claim 15 wherein said getter material is comprised of zeolite, a reactive metal, a reactive metal-oxide or a reactive metal-sulfide.

19. The device of claim 15 wherein said getter material is a tablet that is over said active electronic layer.

20. The device of claim 1, further comprising multiple barrier and getter layers on said second electrode, wherein said multiple barrier and getter layers are in contact with one another.

21. The device of claim 1, wherein the second electrode is formed of one of aluminum, indium, silver, gold, magnesium, calcium, barium, combinations thereof or an alloy thereof.

22. The device of claim 1, wherein the baffler layer is directly on the second electrode.

23. A method of forming an electronic device for emitting light, comprising:
    depositing a barrier material onto said device,
    wherein said barrier material is selected from the group consisting of molybdenum carbide, vanadium carbide, an oxide of a molybdenum alloy, an oxide of a boron alloy, an oxide of a vanadium alloy, a composition comprising sodium, aluminum, and fluorine, and mixtures thereof, wherein said device comprises:
  a substrate;
  a first electrode on said substrate;
  an active electronic layer comprising an organic material on said first electrode; and
  a second electrode on said active electronic layer.

24. The method of claim 23, wherein said device further comprises a first efficiency enhancing layer between said first electrode and said active electronic layer.

25. The method of claim 24 wherein said device further comprises a second efficiency enhancing layer between said active electronic layer and said second electrode.

26. The method of claim 24, wherein said barrier material is comprised of molybdenum carbide, vanadium carbide or mixtures thereof.

27. The device of claim 23 further comprising a getter material.

28. The device of claim 27 wherein said getter material is comprised of a zeolite, a reactive metal, a reactive metal-oxide or a reactive metal-sulfide.

29. The device of claim 27 wherein said getter material is a tablet that is over said active electronic layer.

30. The method of claim 23, wherein the second electrode is formed of one of aluminum, indium, silver, gold, magnesium, calcium, barium, combinations thereof or an alloy thereof.

31. The method of claim 23, wherein the barrier layer is directly on the second electrode.

* * * * *

UNITED STATES PATENT AND TRADEMARK OFFICE
CERTIFICATE OF CORRECTION

PATENT NO. : 7,224,116 B2 Page 1 of 1
APPLICATION NO. : 10/242656
DATED : May 29, 2007
INVENTOR(S) : Reza Stegamat It is certified that error appears in the above-identified patent and that said Letters Patent is hereby corrected as shown below:

Column 12, line 8 at Claim 3, replace:
"wherein said baffler layer" with
--wherein said barrier layer--

Column 12, line 56, Claim 22, replace:
"wherein said baffler layer" with
--wherein said barrier layer--

Column 13, line 13, Claim 26, replace:
"The method of claim 24" with
--The method of claim 23--

Signed and Sealed this

Eighth Day of April, 2008

JON W. DUDAS
*Director of the United States Patent and Trademark Office*